May 30, 1950 F. CAROSELLI 2,509,478

PIEZOELECTRIC CRYSTAL APPARATUS

Filed May 10, 1948 4 Sheets-Sheet 1

INVENTOR
F. CAROSELLI
BY W. J. O'Neill
ATTORNEY

May 30, 1950 F. CAROSELLI 2,509,478

PIEZOELECTRIC CRYSTAL APPARATUS

Filed May 10, 1948 4 Sheets-Sheet 2

INVENTOR
F. CAROSELLI
BY W. J. O'Neill
ATTORNEY

May 30, 1950 F. CAROSELLI 2,509,478

PIEZOELECTRIC CRYSTAL APPARATUS

Filed May 10, 1948 4 Sheets-Sheet 3

INVENTOR
F. CAROSELLI
BY W. J. O'Neill
ATTORNEY

PIEZOELECTRIC CRYSTAL APPARATUS
Filed May 10, 1948 4 Sheets-Sheet 4
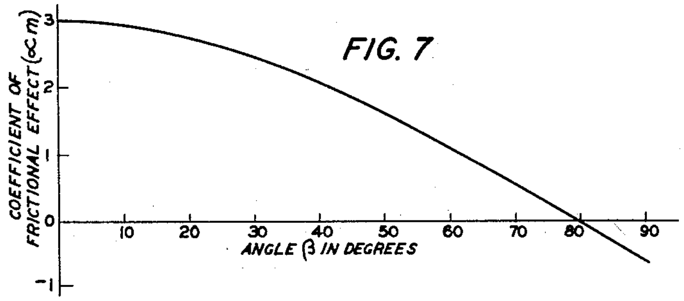
FIG. 8
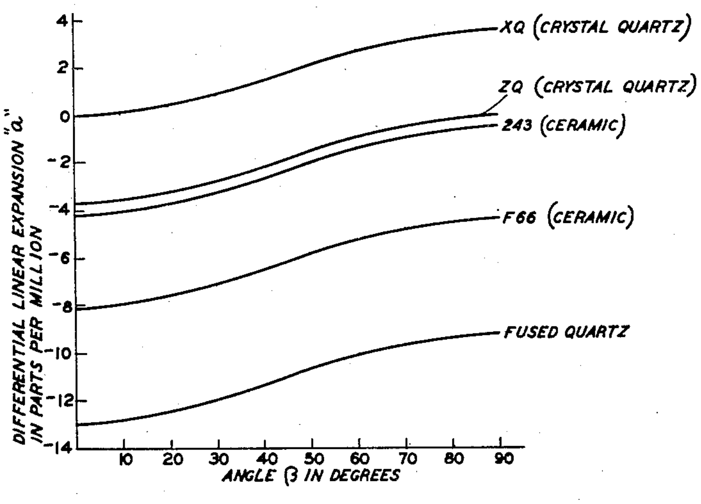
LEGEND:
XQ–QUARTZ ELECTRODES WITH LANDS ALONG X AXIS.
ZQ–QUARTZ ELECTRODES WITH LANDS ALONG Z AXIS.
243–ALSIMAG 243
F66–STEATITE F66
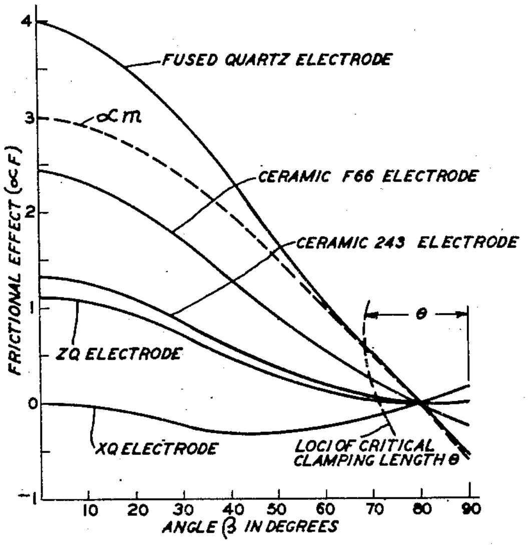
FIG. 9
INVENTOR
F. CAROSELLI
BY W. J. O'Neill
ATTORNEY Patented May 30, 1950 2,509,478

UNITED STATES PATENT OFFICE 2,509,478

PIEZOELECTRIC CRYSTAL APPARATUS

Frank Caroselli, Maplewood, N. J, assignor to Bell Telephone Laboratories, Incorporated, New York, N. Y., a corporation of New York Application May 10, 1948, Serial No. 26,013

17 Claims. (Cl. 171—327)

This invention relates to piezoelectric crystal apparatus and particularly to arrangements adapted for mounting a piezoelectric crystal body in such a manner that clamps or other rigid stays are utilized in fixed contact relation with respect to the surface of the piezoelectric crystal body and restrain its freedom to vibrate in piezoelectric response, in such a mode of motion, for example, as the high frequency harmonic thickness mode required of crystal elements for use as frequency determining circuit elements in high frequency oscillation generator systems and electric wave filter systems.

One of the objects of this invention is to improve the frequency stability of piezoelectric crystal units.

Another object of this invention is to provide improved mounting arrangements for a piezoelectric crystal body.

Another object of this invention is to control the temperature-frequency characteristics of a piezoelectric crystal body.

Another object of this invention is to render a clamped or pressure-mounted piezoelectric crystal body substantially free from frequency changes resulting from frictional slipping forces applied to the crystal body by its contiguous clamping means, as produced by ambient temperature changes applied thereto.

Another object of this invention is to render a piezoelectric crystal body substantially free from frequency changes resulting from the action of rigid stays fixed to the surface of the crystal body in such a manner as to restrain the crystal body from vibrating freely in piezoelectric response as the rapidity of changing the temperature of the crystal apparatus is varied.

Another object of this invention is to reduce the frictional slipping force between a crystal body and its clamping means.

In piezoelectric crystal units such as those employing a quartz crystal element as a circuit element, the crystal electrodes are used to provide the electric coupling between the associated electrical circuit and the piezoelectric crystal body by impressing upon the piezoelectric body the voltage that is necessary to drive it in vibration. It is generally desirable that the mounting arrangements have little or no adverse effect on the desired mode of vibration of the piezoelectric crystal plate and that they be designed to retain the inherently high frequency stability of the piezoelectric crystal plate itself.

The mounting members for the quartz crystal element may be composed of similar plates of insulating material such as circular-shaped ceramic, glass, or crystal quartz discs having substantially flat and parallel major surfaces, the inner surfaces being provided with raised metallic coatings or lands disposed at or near the peripheral or marginal edges of the inner major surfaces of the pair of mounting members, with the raised clamping lands resting against the major faces of the piezoelectric quartz plate adjacent the periphery thereof to spacially separate the inner surface of the mounting member from the surface of the quartz crystal element.

The crystal electrodes may be of the air-gap type in which a pair of central field-producing electrodes are spacially separated from the quartz element by a very small air-gap, which may be of the order of 2 to 20 microns, for example.

The central electrode area may be obtained by means of a metallic coating centrally disposed on the inner major surfaces of the insulating mounting members and separated from the peripheral lands upon the mounting members. The relative thickness of the peripheral coatings of the raised lands with respect to the thickness of the central coatings forming the electric field-producing electrodes, determines the air-gap spacing between the piezoelectric crystal plate and the central field-producing coatings referred to, the crystal plate being clamped adjacent to its periphery between the raised clamping lands or risers by means of suitable spring means resiliently holding the crystal and electrode assembly in compression.

The crystal electrodes may also be of the plated type in which a pair of field-producing electrodes are plated as central metallic coatings directly upon the surface of the crystal element. In such a case, the only coatings upon the mounting members used to clamp the piezoelectric crystal plate is the peripheral raised lands, having a thickness such that the surface of the mounting members is spacially separate from the surface of the metallic electrode disposed upon the surface of the crystal element.

This invention is not directly concerned with the manner of providing the metallic coatings that form the central oppositely disposed field-producing electrodes and accordingly any suitable means whereby central field-producing electrodes are provided will suffice for the objects of this invention. Hereinafter, whenever insulating mounting members are utilized in connection with the description of the features of this invention, it may be assumed that electrodes of the air-gap type are used and that the mounting members are electroded.

A difficulty experienced heretofore when utilizing piezoelectric crystal elements in practical systems has been that the temperature-frequency characteristic curve is not repetitious exactly and often takes a form much like a hysteresis loop when plotted in the form of a temperature-frequency curve through a complete increasing and decreasing temperature cycle. This form of temperature instability is due to differences in the thermal expansions of the materials held in contact with the quartz or other piezoelectric crystal body. The instability appears in two forms and depends on the magnitude of the flow of heat into the crystal unit and on the direction of the flow of heat as to whether the crystal unit is being heated or cooled by virtue of the flow of heat, or on both the magnitude and direction. An instability in frequency due only to the reversal of the direction of flow of heat into the crystal unit will be referred to hereinafter as instability of the first kind. An instability in frequency due to the magnitude of the flow of heat into the crystal unit will be referred to hereinafter as instability of the second kind.

Frequency instability of the second kind is experienced whenever the temperature-frequency characteristic curve is found not to be repetitious exactly, and on repeating the complete increasing and decreasing temperature cycle portions of the temperature-frequency characteristic curve do not retrace over the temperature-frequency characteristic curve obtained during the application of a previous complete increasing and decreasing temperature cycle.

Frequency instability of the first kind is experienced when it is found that the temperature-frequency characteristic curve obtained during cooling of the crystal unit is shifted in frequency from the temperature-frequency characteristic curve obtained during heating of the crystal unit and that the two curves, heating and cooling, appear alike in form.

The first kind of frequency instability is due to a relative displacement of the area of contact between the mounting members and the piezoelectric crystal body that is due to differential thermal changes in the dimensions of the mounting members relative to the changes in the dimensions of piezoelectric crystal body. The differential thermal effect causes a slipping frictional force to exist at the point of contact between the mounting members and the piezoelectric crystal body which slipping force places a restraint upon the freedom of vibration of the piezoelectric crystal body in piezoelectric response to an electric potential.

The second kind of frequency instability is due also to the differential thermal changes in the dimensions of the mounting members relative to the changes in the dimensions of the piezoelectric crystal body. The force resulting from the change causes frequency instability to appear only when its magnitude is changed as the rate of flow of heat is changed in magnitude but not in direction.

This second kind of frequency instability is also present when the clamping forces remain rigid or fixed upon the surface of the piezoelectric crystal body and there is no slipping or relative displacement at the point of attachment of the mounting members. In such a case, the flow of heat into the crystal unit will cause differential changes in dimensions of the mounting members with respect to the changes in the linear dimensions of the piezoelectric crystal body. The differential changes will vary as the rapidity of supplying heat to the crystal unit varies so that on plotting a temperature-frequency characteristic the plot obtained will reflect the actual rate at which the temperature of the piezoelectric crystal body is changing as well as the effect of the forces imposed on the piezoelectric crystal body due to the particular value of the differential changes in dimensions of the piezoelectric crystal body and the mounting members. The frequency-temperature characteristic obtained for any portion of the complete increasing and decreasing temperature cycle will not retrace exactly over a previous measurement of that portion of the frequency-temperature characteristic curve unless the rate of change of temperature of all members of the crystal unit change in the same manner for both measurements of the same portion of the complete increasing and decreasing frequency-temperature cycle. The characteristics of the frequency instability of the second kind that distinguishes it from the first is that with unlike rates of heating over the same portion of the complete increasing and decreasing cycle, unlike forces of restraint are imposed upon the freedom of vibration of the piezoelectric crystal body as it vibrates in piezoelectric response to an electric field.

The frequency instability of the first kind is only manifest when the differential forces upon the piezoelectric crystal body are associated with slipping at the point of contact of the mounting members in association with the piezoelectric crystal body. If the point of contact is maintained by a clamping pressure, slipping is likely to occur and the first kind of temperature instability may appear in the complete temperature-frequency cycle. If the point of contact is rigid such as in the case of cemented wires to the surface of the piezoelectric crystal body, only the second kind of frequency instability will occur. Another distinguishing characteristic is that the frequency instability of the first kind includes also and is inherently associated with frequency instability of the second kind, while in the case of fixed points of attachment of the mounting members to the piezoelectric crystal body, there can be no slipping and only the second kind of instability can occur.

Another distinguishing characteristic of the frequency instability of the first kind is that it occurs only when the direction of heating or algebraic sign associated with the flow of heat is reversed. Immediately, on reversal of temperature from heating to cooling, or vice versa, the frictional forces become immediately zero and the frequency of the piezoelectric crystal body immediately shifts or drifts to the value at which the differential thermal forces upon the piezoelectric crystal body are zero. This sudden and precipitous change in frequency occurs immediately on arresting the flow of heating and causing a reversal of the flow, and without any apparent change in temperature of the piezoelectric crystal body. As the reversed direction heating is continued in application to change the temperature of the crystal unit, the differential thermal changes cause the frictional forces to again build up but in reverse direction to their former direction and the frequency of the piezoelectric crystal body shifts further in the direction away from the value it had just before the reversal of temperature was effected. The added shift or continued "drift" of the frequency is more gradual than first occurred on reversal of temperature and depends on the rate of flow of heat into the unit. When the slipping force assumes the maximum value it may attain under the conditions imposed by the spring clamping forces and the polish or coefficient of friction of the material of the mounting member in contact with the piezoelectric crystal body, the frequency shift due to changing slipping forces ceases and the temperature-frequency characteristic assumes the shape of a typical heating or cooling curve for the particular piezoelectric crystal body and its steady state mounting effects.

Another distinguishing characteristic of the instability of the first kind is that it only occurs on reversal of the flow of heat and only when the forces associated with the stays of the mounting members in contact with the piezoelectric are slipping frictional forces which depend on actual relative displacement of the contacting areas of the mounting members and the piezoelectric crystal body.

The hysteresis loop appearing for the complete frequency-temperature cycle may be divided into portions for which the temperature instability is only that of the first kind, and temperature instability that is only of the second kind and temperature instabilities that are due to the combined effect of both kinds. The portions are distinguished by the magnitude and direction of flow of heat into the unit. For portions for which the flow of heat is suddenly reversed, the immediate effect is a temperature instability of the first kind and the frequency of the piezoelectric crystal body shifts with no change in temperature; as the reversal of heat flow continues the temperature reverses and increases in the reverse direction and the frequency shift continues until the frequency instability of the first kind assumes its maximum value. The frequency "drift" ceases and the temperature-frequency characteristic of the crystal unit assumes either its typical heating or cooling curve. As flow of heat remains constant and unidirectional there is no apparent frequency instability, but as the rate of flow of heat is varied and its direction remains unchanged, a frequency instability occurs that is associated only with the magnitude of the flow of heat. This is frequency instability of the second kind.

It has been difficult heretofore to utilize in practical systems the higher order mechanical overtones of a thickness shear mode piezoelectric quartz crystal element with a desired high degree of frequency stability, as a result of frequency changes introduced from temperature changes. Due to differences in thermal expansions of the materials held in pressure contact with the quartz or other vibratory piezoelectric crystal body, the frequency characteristic of the clamped type of piezoelectric crystal unit may be affected by the nature of the mounting arrangements in such a manner as to produce changes in the frequency characteristic with changes in the ambient temperature depending upon the direction of the temperature gradient applied thereof, and resulting in a temperature-frequency characteristic that looks much like a hysteresis loop when plotted in the form of a temperature-frequency curve through a complete increasing and decreasing temperature cycle. Such frequency instabilities with changes in the flow of heat into the crystal unit may be remedied in accordance with this invention.

In accordance with one feature of this invention, a piezoelectric crystal body, such as an AT-cut type quartz crystal plate operating in a thickness shear mode of motion, may be pressure-mounted and clamped between clamping lands, the clamping lands being so proportioned in area and position with respect to the surface of the crystal body as to control the temperature-frequency characteristics of the clamped crystal unit and thereby prevent shifts in the crystal frequency resulting from forces due to differential thermal conditions obtaining between the crystal body and its associated mounting members due to ambient temperature changes applied thereto. A feature of interest is that certain different force-frequency effects have been found to exist along different axes of AT-cut, BT-cut and other types of crystal bodies, and that these effects may be utilized in cooperation with the size and position of the clamping lands in contact therewith in order to nullify the components of such force-frequency effects on the crystal body and thereby render the crystal body substantially free from frequency changes resulting from forces due to differential thermal conditions applied to the crystal body by the clamping lands, as produced by changes in the magnitude and direction of the flow of heat applied thereto.

In accordance with this invention the temperature-frequency characteristics of a crystal unit in which the crystal element has rigid constraints fixed to its surface, the hysteresis loop area of the temperature-frequency curve of the second kind may be controlled and reduced to substantially zero. For this purpose, the clamping areas may be proportioned with respect to the opposite frequency change effects that have been found to exist along the two mutually perpendicular axes of the crystal faces which in the case of an AT-cut type quartz crystal plate may be the mutually perpendicular Z′ and X′ axes, the areas of contact between the mounting members and the piezoelectric body having an area and position such that the effect of the component of force along the direction of the X axis of the crystal plate nullifies the effect of the component of the force along the direction of the Z′ axis of the crystal plate, and the areas of contact being preferably positioned near the axis of the crystal plate which has the smallest temperature coefficient of expansion and which in the case of an AT-cut quartz plate may be the Z′ axis referred to.

The mounting members, which may be utilized to support the clamping lands, may be composed of a suitable ceramic material such as "Steatite F66" or "Alsimag 243." "Steatite F66" is a type of steatite ceramic material as described in Patent No. 2,332,343 issued October 19, 1943, to M. D. Rigterink (Example 1), assigned to Bell Telephone Laboratories, Incorporated. "Alsimag 243" is a type of ceramic material as described in Tele-Tech, February 1947, "Low-Loss Ceramic Dielectric" by Hans Thurnauer, and in Bulletin of American Ceramics Society, vol. 26, No. 3, March 1947, page 85 by Hans Thurnauer. The latter has a temperature coefficient of expansion which is almost double that of the former and which is almost matched or equal to the temperature coefficient of expansion of an AT-cut type quartz plate along the direction of the Z′ axis thereof referred to, and hence may be advantageously utilized with clamping lands thereon to clamp such a crystal plate along the Z′ axis referred to with but little resulting frictional slipping force applied to the crystal plate when the unit is subjected to temperature changes. Alternatively, the electrode members may be composed of other types of material which has a thermal expansion and composition matching that of the piezoelectric crystal element mounted therebetween. For example, the clamping electrode members may be composed of crystal quartz which in the case of use with an AT-cut type quartz piezoelectric vibrator, may also be AT-cut quartz clamping electrode members so oriented in the assembled unit that the X axes of the clamping electrodes and the piezoelectric plate therebetween are all aligned with respect to each other thereby to obtain a matching of the temperature coefficients of expansion for all directions of thermal expansion along the faces of the vibratory crystal plate. In such a matched quartz arrangement, the quartz electrode members may be provided with any suitable clamping lands thereon such as four pairs of oppositely disposed peripheral clamping lands, or two pairs of such clamping lands positioned along the X axis or along the Z′ axis of the electrode members.

Where the mounting members are composed of insulating material which does not entirely match the piezoelectric crystal plate in respect to the matter of equal temperature coefficients of thermal expansion, steps may be taken to insure that the frictional slipping force will be uniform and the clamping lands may be proportioned and positioned with respect to the opposite frequency change effects found along the directions of mutually perpendicular axes of the clamped crystal faces, which in the case of an AT-cut quartz plate may be the Z′ axis and the X′ or X axis.

The frictional forces between the piezoelectric crystal plate and its clamping lands may be reduced to a point where the mounting may not materially affect the temperature-frequency characteristics of thte piezoelectric crystal plate by such expedients as making the piezoelectric crystal plate surfaces as smooth as possible in the regions of contact with the clamping lands, by polishing the contact surfaces of the lands and by reducing the clamping pressure to a point that just insures contact of the clamping lands with the piezoelectric crystal body clamped therebetween.

Another feature of interest is that the temperature gradient effect may itself, if desired, be controlled to be of large value and repetitious, in that an almost vertical shift in the frequency of the crystal body may be effected by small reverses from increasing to decreasing temperatures or vice versa applied to the crystal unit, if the forces due to thermal differences are made large and uniform, as for example by making the clamping pressure large, and applying it along the direction of the axis of large frictional slippage, as along the X axis in the case of an AT-cut type quartz crystal plate; or by attaching to the surface of the crystal plate a material having either a zero temperature expansion coefficient or a thermal coefficient large in relation to that of the AT-cut type quartz crystal plate. In this latter instance, the mounting material may be fashioned similar in shape to the insulating discs described hereinafter except that the raised lands attaching the material to the crystal plate may be a cement holding firmly the material to the crystal plate at the areas and position on the plate otherwise occupied by the raised lands. The cement may be hard and cause the surface of the material to be specially separated from the surface of the crystal plate.

While the invention is described and illustrated herein particularly in connection with AT-cut quartz plates, it will be understood that it may be utilized in connection with similar effects in other forms of quartz plates or other forms of piezoelectric crystal substances. Also, while the invention is described and illustrated herein particularly in connection with AT-cut quartz plates, in which the contact between the mounting members and quartz plate gives rise to slipping frictional forces as the only form of the forces due to the differential thermal conditions, it will be understood that the invention may be utilized in connection with any means for mounting the piezoelectric quartz plate that imposes upon the plate forces due to differential thermal conditions, including forces imposed when the mounting members are attached rigidly and directly to the surface of the crystal plate, the invention being realized by proportioning the area of contact between the mounting member and the piezoelectric body and by positioning the area of contact.

For a clearer understanding of the nature of this invention and the additional advantages, features and objects thereof, reference is made to the following description taken in connection with the accompanying drawing, in which like reference characters represent like or similar parts and in which:

Fig. 7 is a graph illustrating the relation between the coefficient of frictional effect $\alpha m$ and the value of the angle $\beta$ of Fig. 3;

Fig. 8 is a graph illustrating the relation between the differential linear expansion $a$ and the value of the angle $\beta$ of Fig. 3; and Fig. 9 is a graph illustrating the relation between the frictional effect $\alpha F$ and the value of the angle $\beta$ of Fig. 3.

Figure 1:
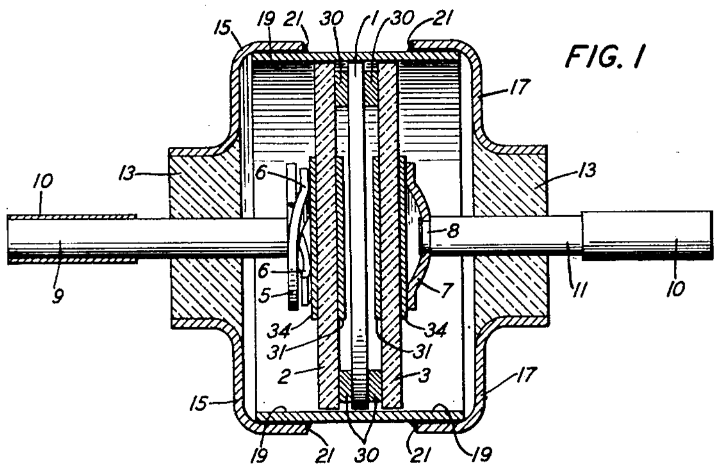
Fig. 1 is an enlarged sectional view illustrating a general assembly arrangement for a piezoelectric crystal unit of the pressure type.

Referring to the drawing, Fig. 1 is a greatly enlarged view in section of a pressure type crystal unit comprising a piezoelectric crystal element 1 which may be in the form of a thin circular shaped quartz crystal disc or plate held between a pair of circular shaped electroded mounting members 2 and 3. The mounting members 2 and 3 may comprise similar ceramic, quartz or other suitable insulating discs having the same or nearly the same diameter as that of the piezoelectric crystal disc 1, the electroded members 2 and 3 being provided on their inner major faces with oppositely disposed peripheral metallic coatings 30 adapted for pressure-clamping the periphery of the crystal disc 1 therebetween and also with oppositely disposed central coatings 31 adapted for applying an electric field to the central region of the crystal disc 1.

As illustrated in Fig. 1, the assembly comprising the piezoelectric crystal disc 1 and the pair of associated electroded members 2 and 3 may be resiliently held in compression by means of a suitable spring 5 disposed in contact with an electrode terminal coating 34 disposed on the outer major surface of the member 2 and a suitable contact bracket 7 disposed in contact with the electrode terminal coating 34 disposed on the outer major surface of the member 3. The spring 5 and the bracket 7 may be individually carried by and mounted on the inner ends of two coaxially disposed pins or rods 9 and 11 respectively. The support pins 9 and 11 may be composed of metal rods and may extend through suitable openings in the central part of each of two glass or other suitable insulating seals 13 which may be inserted in the opposite end openings of metal covers 15 and 17 respectively of a cylindrical shaped metal casing 19. The end covers 15 and 17 may be secured to the cylindrical metal case 19 by any suitable means such as by solder joints 21 which may extend around the entire inner rim of the metal covers 15 and 17 at points adjacent the outer surface of the metal casing 19. The outermost peripheral edges of the pair of electroded insulating members 2 and 3 and also that of the piezoelectric crystal plate 1 may be of similar circular form and disposed in loose fitting relation with respect to the inner wall of the cylindrical metal case 19. The outer end portions of the metal rods 9 and 11 may be coated with silver plating 10, if desired, in order to provide good electrical contact connections with suitable spring clips or sockets (not shown) in which they may be mounted. Individual electrical connections to the two opposite major faces of the piezoelectric crystal element 1 may be established through the conductive pins 9 and 11, the conductive bracket 7, and the conductive spring 5, the spring 5 and the bracket 7 contacting two suitable conductive or metallic terminal coatings 34 individually connected by metallic coatings 33 with the respective electric field-producing metallic coatings 31 formed integral with the central region of the inner major surfaces of each of the pair of similar insulated electroded members 2 and 3.

Figure 2:
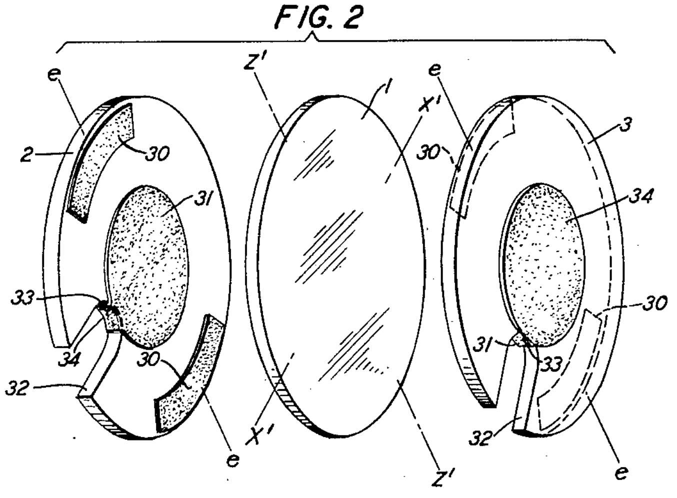
Fig. 2 is an enlarged exploded perspective view illustrating the crystal and electroded mounting assembly part of the general assembly shown in Fig. 1.

The contact bracket 7 may be formed from a suitable circular shaped brass or other metal disc pressed out at its central region into a cup or dish shaped bracket 7, as illustrated in edge view in Fig. 1. At its center, the bracket 7 may be provided with a small hole 8 for mounting the bracket 7 upon the end of the supporting rod 11, and the bracket 7 may be plated with tin, silver or other suitable metal in order to provide good electrical conductivity. The conductive clamping spring 5, an edge view of which is shown in Fig. 1, may be formed from a circular shaped sheet of hardened beryllium copper or from other suitable spring material and after forming the two spiral shaped spring arms 6, the spring 5 may be suitably heat treated and then silver plated to provide good electrical conductivity. As shown in Fig. 1, the spring arms 6 of the spring 5 may make direct electrical and mechanical contact with the metallic terminal coating 34 formed integral with the outer major surface of the adjacent insulating member 2 and thereby function to establish electrical connection as well as to apply resilient clamping pressure to the piezoelectric crystal element 1 which is thereby resiliently clamped between the oppositely disposed raised lands 30 on the electroded members 2 and 3. As shown in Fig. 1, the assembly comprising the pair of metallized insulating members 2 and 3 and the single quartz piezoelectric plate 1 is mounted between the spring contact 5 and the cup contact 7. As illustrated in Fig. 2, the metal deposit 33 in the slot 32 in each of the insulating members 2 and 3 provides electrical continuity from the terminal contact spot 34 on one side thereof to the field producing electrode spot 31 on the other side thereof. The metal lands 30 deposited along the periphery of the insulating members 2 and 3 are made thicker than the central electrode spot 31 in order to provide an air-gap between the central electrode spot 31 and the quartz piezoelectric plate 1.

The container and general assembly arrangement illustrated in Fig. 1 may be of the types disclosed in application Serial No. 637,662, filed December 28, 1945, by H. Havstad now United States Patent 2,453,435, dated November 9, 1948, and in application Serial No. 623,150, filed October 18, 1945, by L. J. La Brie now Patent #2,486,482, dated November 1, 1949.

The piezoelectric crystal element 1 may be any suitable piezoelectric element such as a thickness shear mode AT-cut or a BT-cut quartz crystal plate operated at its fundamental or any odd order mechanical harmonic or overtone thereof. Such AT-cut and B-cut quartz crystal plates are disclosed for example in United States Patent 2,218,200 issued October 15, 1940, to Lack, Willard, and Fair. While the present invention is described particularly in connection with an AT-cut quartz crystal element 1 which employs thickness vibrations of the shear type, it will be understood that the piezoelectric crystal body 1 may be of other suitable types of crystal cuts in quartz, or in other piezoelectric substances.

Fig. 2 is an enlarged perspective view illustrating the crystal and electroded members forming part of the general assembly shown in Fig. 1. As illustrated in Figs. 1 and 2, the piezoelectric crystal element 1 is disposed between the pair of similar electroded members 2 and 3, and the assembly is held in compression by means of a suitable compression force exerted by the spring prongs 6 of the clamping spring element 5 as illustrated in Fig. 1. As shown in Figs. 1 and 2, the pair of electroded members 2 and 3 are each provided with a pair of metallic risers or clamping lands 30 extending arcuately along the inner peripheral margins of each of the electroded support members 2 and 3 and contacting the respective opposite major faces of the piezoelectric crystal plate 1 adjacent the peripheral edges thereof, thereby to resiliently clamp the piezoelectric body 1 between the oppositely disposed clamping lands 30 provided on each of the electroded support members 2 and 3 mounted between the cup contact 7 and the spring contact 5 as illustrated in Fig. 1. A small but sufficient clamping force may be applied by the spring 5 to the major face margins of the piezoelectric crystal element 1 to prevent its bodily displacement with respect to the clamping lands 30 formed integral with the inner major surfaces of the electroded support members 2 and 3. In using a piezoelectric crystal plate 1 adapted for high frequency or short wave applications, the frequency of vibration is determined mainly by the thickness dimension which is the thin dimension of the piezoelectric plate 1. Clamping near the peripheral edges of the piezoelectric plate 1 is effective in suppressing to some extent spurious modes of motion therein and thereby stabilizing the desired thickness mode frequency.

The air-gap lying between each of the centrally disposed electric field-producing electrode coatings 31 and the adjacent major face of the crystal plate 1 may be critically controlled by close control of the relative thicknesses of the deposited metal coatings forming the central field-producing electrode 31 and the peripheral clamping lands 30. Usually, good amplitude of vibration of the crystal element 1 may be achieved when the central riser 31 on each of the support members 2 and 3 provides an air-gap of the order of 2 to 4 microns with respect to the respective adjacent major faces of the piezoelectric plate 1, the central riser 31 having a rise which is slightly or somewhat less than that of the marginal arcuate clamping risers 30. The central risers 31 comprise the effective field-producing electrode surfaces, and the peripheral risers 30 comprise the clamping means for the crystal element 1. The raised metallic lands 30 on each of the two support members 2 and 3 may be made of substantially equal heights and thus utilized to engage and pressure-clamp the piezoelectric crystal plate 1 at the peripheral or marginal region thereof, the central field-producing electrodes 31 being barely out of direct contact with the adjacent major faces of the piezoelectric crystal plate 1.

As illustrated in Figs. 1 to 5, the support disc insulator members 2 and 3 may each have a size and shape to suit the dimensions of the crystal element 1 with which the insulating discs 2 and 3 are associated, the diameter of each of the three discs 1, 2 and 3 being of the order of one-half inch or other desired size. The thickness of the insulating discs 2 and 3 may be made of the order of one-sixteenth inch or of other suitable thickness value in order to provide suitable mechanical stability. As illustrated in Figs. 2, 4, 4A and 5, each of the pair of insulating disc members 2 and 3 may be provided with an opening or slot 32 extending through the body of the insulating discs 2 and 3 from one major surface to the opposite major surface thereof. The slots 32, as illustrated in the drawing, may be located at an edge and extend along a major face diameter of each disc 2 and 3 towards the center thereof and up to the edges of the circular-shaped metallic coatings 31 and 34 disposed oppositely on the opposite major surfaces of each insulating disc 2 and 3. The slots 32 may be slightly rounded off to merge smoothly with the opposite major surfaces of each disc 2 and 3, and may each be sufficiently coated with a layer of conductive metal coating 33 in order to form a good electrical connection 33 extending from the metallic coating 31 to the metallic coating 34 on the opposite major surfaces of each of the insulating discs 2 and 3. Before applying the metallic coatings 30, 31, 33 and 34 to the insulating discs 2 and 3, the major surfaces thereof and particularly those adapted to face the piezoelectric disc 1 may be lapped as flat as is conveniently possible.

The coatings 30 comprising the peripheral clamping lands 30 and the coatings 31 comprising the central electrodes 31 may be composed of silver or other suitable metal deposited by evaporation in vacuum upon the inner major surfaces of each of the insulating disc members 2 and 3. The terminal coatings 34 on the outer major surfaces of each of the insulating discs 2 and 3, and also the interconnection coatings 33 in the slots 32 between the coatings 34 and 31, may conveniently consist of baked silver paste coatings or other suitable coatings for providing good electrical connection from the terminal coatings 34 to the respective associated central electrode coatings 31. The terminal coatings 34 need not be critical in size, area, shape or thickness and may, as shown in the drawing, be circular in shape and made of a small diameter to make contact with the spring 5 and cup-contact 7, as illustrated in Fig. 1.

The coatings 30 and 31 on the inner major surfaces of each of the insulating disc members 2 and 3 may conveniently consist of thin films of silver deposited by evaporation in vacuum thereon, the position, area and shape of the coatings 30 and 31 being controlled by use of a suitable masking jig or jigs during the evaporation process. The thickness of the central metallic film 31 may be approximately 0.5 micron and that of the several peripheral metallic films 30 may be made slightly more in order to determine the air-gap spacing between the coatings 31 and the respective associated major faces of the piezoelectric element 1. The face area of the oppositely disposed metallic films 31 determines the area of the electric field applied to the piezoelectric disc 1 and may be placed concentrically with respect to the major face area of the associated crystal disc 1, as illustrated in the drawing. The peripheral coatings 30, oppositely disposed on each of the insulating discs 2 and 3, may be deposited in the form of arcuate strips or other suitable areas separated from each other and made of an equal and uniform thickness slightly greater in thickness value than the thickness value of central metallic coatings 31.

In general, each of the insulating discs 2 and 3 may be processed as follows: apply and bake the silver paste coatings 33 in the slots 32, lap the discs 2 and 3 to size with emery until the major surfaces thereof are flat and parallel to within about one micron, apply and bake the silver paste coatings 34 to one side, clean the opposite side by a few strokes of lapping by hand, apply the evaporated silver coatings 30 and 31 to critical thickness and dimensions, and burnish the evaporated silver coatings 30 and 31.

As an illustrative example, each of the insulating discs 2 and 3 may have a thickness of about 0.061 inch and a diameter of about 0.496 inch, each disc 2 and 3 being provided with small slots 32. The arcuate form of marginal strips 30 may have a width of about 0.031 inch, and be of a uniform thickness of about 4.0 microns and have a critical arcuate length of $2\theta$ degrees as described more fully hereinafter. The peripherally-disposed lands, when made of circular form as illustrated in Fig. 4A, may each have a diameter of about 0.031 inch and may be disposed as described more fully hereinafter. The central electrode coatings 31 may have a smaller uniform thickness of about 0.50 micron and an effective diameter of about 0.25 inch or other value to suit the value of the frequency, and may be located concentrically with respect to the periphery of each of the insulating discs 2 and 3. The terminal coatings 34 may have a thickness of about 0.002 inch and a diameter of about 0.25 inch, and may be located concentrically with respect to the circular periphery of each of the insulating discs 2 and 3.

Figure 3:
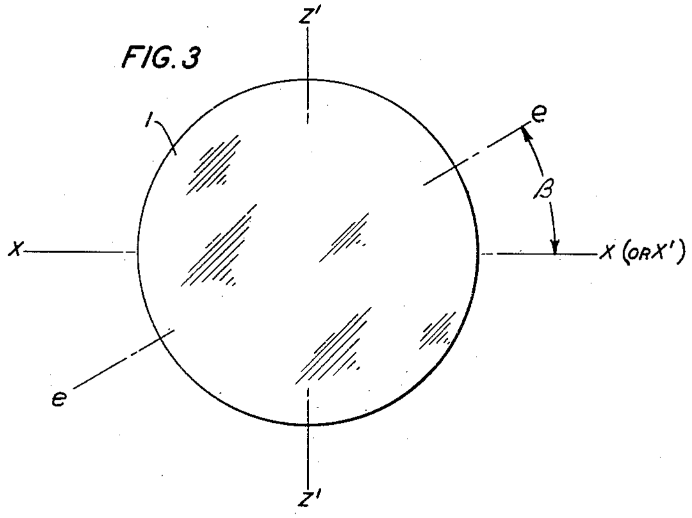
Fig. 3 is an enlarged major face view of the piezoelectric crystal plate of Figs. 1 and 2, illustrating particularly a circular shaped AT-cut type quartz crystal plate having its mutually perpendicular X and Z′ axes along the major faces thereof.
Figure 4:
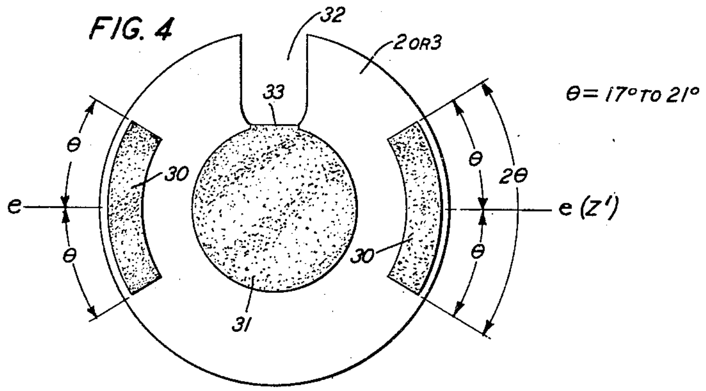
Fig. 4 is an enlarged inner major face view of each of the pair of similar electroded mounting members shown in Figs. 1 and 2, as provided with two raised metallic clamping lands extending arcuately along the periphery thereof and having an axis *e—e*.
Figure 4A:
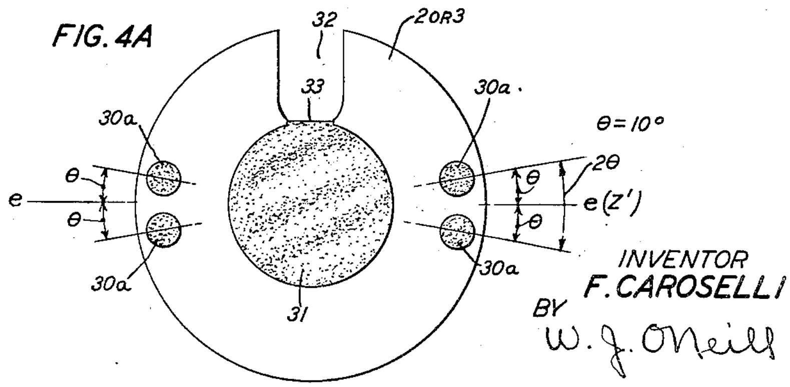
Fig. 4A is an enlarged inner major face view of each of the pair of similar electroded mounting members shown in Figs. 1 and 2, as provided with four raised metallic lands circular in shape and symmetrically disposed about axis *e—e* at an angle $\theta$.
Figure 5:
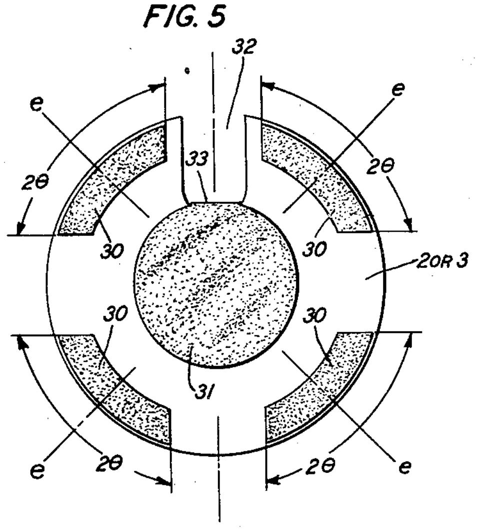
Fig. 5 is an enlarged inner major face view of each of the pair of similar electroded mounting members shown in Figs. 1 and 2, but provided with four symmetrical raised metallic clamping lands, instead of two lands as illustrated in Fig. 4.

Fig. 3 is an enlarged major face view of the circular shaped piezoelectric crystal disc 1 illustrated in edge view in Fig. 1 and Fig. 4 is an enlarged inner major face view of each of the pair of similar electroded members 2 and 3, illustrated in sectional edge view in Fig. 1. As illustrated in Fig. 4, each of the insulating disc electroded members 2 and 3 is provided with two peripheral raised clamping lands 30 each having a length of 2$\theta$ degrees and a symmetrical axis labeled *e—e*. As illustrated in Fig. 4A, each of the insulating disc electroded members 2 and 3 is provided with four peripheral raised clamping lands 30*a* each having a diameter of about 0.031 inch and each disposed $\theta$ degrees from the axis labeled *e—e*. As illustrated in Fig. 5, each of the insulating disc electroded members 2 and 3 is provided with four peripheral raised clamping lands 30 each having a length of 2$\theta$ degrees and a symmetrical axis labeled *e—e*.

As illustrated in Fig. 3, the piezoelectric crystal plate 1 is an AT-cut type of quartz plate 1 having known mutually perpendicular X and Z' axes. The position of the axis *e—e* of the clamping lands 30 of each electroded members 2 and 3 of Fig. 4 that may be placed in contact with the opposite major faces of the crystal plate 1 of Fig. 3 is variably indicated in Fig. 3 by the angle $\beta$ between the axes *e* and X. Thus, the axis *e* of the clamping lands 30 of both of the electrode members 2 and 3 may be placed along the X axis, or the Z' axis or along some other axis intermediate the X and Z' axes of the quartz crystal plate 1, according to the value of the angle $\beta$.

Due to differences in thermal expansions of the piezoelectric disc 1 and the associated contacting electrode discs 2 and 3, frictional slipping forces, produced therebetween as a result of temperature changes, may be imposed along the directions of the major faces of the piezoelectric disc 1 and operate to change its frequency of vibration. The magnitude of such frictional forces and the resultant change in frequency will depend upon several factors, and has been found to alter the temperature-frequency characteristics of the crystal unit and give temperature-frequency curves having a sort of hysteresis loop effect between the heating and cooling curves. An example of such temperature-frequency curves is illustrated in Fig. 6.

Figure 6:
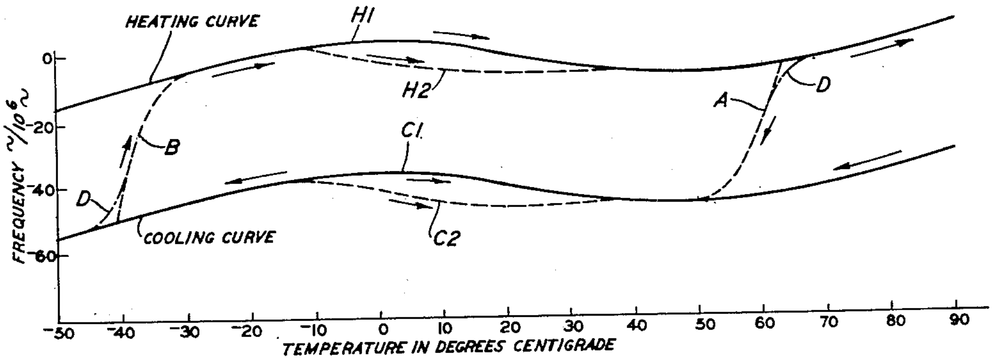
Fig. 6 is a graph illustrating an example of the temperature-frequency hysteresis loop occurring in crystal units as a result of frictional forces applied to the crystal element when taken through a heating and cooling temperature cycle.

Fig. 6 is a graph illustrating an example of the temperature-frequency characteristics of a particular crystal unit of the type illustrated in Fig. 1 using an AT-cut type quartz crystal disc 1 and ceramic type electroded mounting members 2 and 3 provided with clamping lands 30 covering nearly the entire periphery thereof. In this example, the electroded members 2 and 3 being composed of material having a thermal expansion different from that of the piezoelectric crystal disc 1 and having lands clamping the crystal disc 1 substantially over the full periphery thereof impose frictional forces between the crystal plate 1 and the ceramic electrodes 2 and 3 that result in changing the frequency of the crystal plate 1 whenever the unit is subjected to reversals in the direction of the temperature gradient applied thereto, thus giving the hysteresis loop curve illustrated in Fig. 6.

As shown in Fig. 6, the complete temperature-frequency characteristic curve is composed of a heating curve H1 or H2, a cooling curve C1 and C2 and two drift curves A and B. The drift curve indicated by A shows a change in frequency when the applied temperature is reversed from heating to cooling. The drift curve indicated B shows a change in frequency when the applied temperature is reversed from cooling to heating. The heating curve H1 shows a lack of retraceability by the existence of the alternate heating curve H2 which occurs when the rate of heating the unit increases. The cooling curve C1 shows a lack of retraceability by the existence of the alternate cooling curve C2 which occurs when the rate of cooling the unit increases. The complete temperature-frequency cycle results in a sort of temperature-frequency hysteresis loop given by the heating and cooling curves H1 and C1 and the drift curves A and B, or by the alternate loop, the heating and cooling curves H2 and C2 and the drift curves A and B. The drift curve also lacks retraceability for the same reason as the heating and cooling curves. The effect on the curve is to modify the portions marked D to have a larger or smaller curvature as the curve B or A approaches its respective associated heating or cooling curve.

The frequency follows the heating curve during heating, the cooling curve during cooling, and the drift curves A or B whenever the temperature gradient is reversed. The shape of the temperature-frequency curves of the crystal unit depends upon the shape of the natural temperature-frequency curves of the piezoelectric element 1 per se, upon the shape of the drift curves at A and B according to whether the horizontal or vertical component of the curves A and B is large, and upon the rapidity of the flow of heat into and out of the crystal unit. The effect of the direction of heat flow on the vibration of the plate 1 is to change the frequency during the time that the direction of heat flow is changed from heating to cooling or vice versa. An increase in clamping pressure generally increases the magnitude of the frequency change. The thermal expansion of the materials involved sets up stresses on the piezoelectric body 1 which change its frequency. Thus, when the electrode member 2 or 3 extends at a rate different than that of the quartz plate 1, a stress tension or compression is set up in the piezoelectric vibrator plate 1 due to the frictional forces of slipping of one with respect to the other. Such undesired effects in frequency changes may be eliminated or reduced in accordance with this invention and both the heating and cooling curves of Fig. 6 may be made to take the same or nearly the same line following the shape of either the upper or lower curve in Fig. 6.

The magnitude of the frictional slipping forces and the resulting frequency changes in the temperature-frequency characteristics of the crystal unit may be reduced or controlled by control of such factors as the degree of clamping pressure, the composition of the insulating electrode members 2 and 3 relative to that of the piezoelectric element 1, the number of clamping lands 30, the location of the *e—e* axis of the clamping lands 30 with respect to the X, Z' or other major face axis of the piezoelectric body 1, and the proportioning of the lengths 2$\theta$ of the clamping lands 30 with respect to the X or Z' axes of the piezoelectric body 1 and the degree of surface polish of the clamping area of both the lands 30 and crystal plate 1.

Reducing the magnitude of the frictional forces applied to the piezoelectric disc 1 reduces the magnitude of the frequency changes in the piezoelectric disc 1. If the clamping pressure exerted by the spring 5 of Fig. 1 upon the three clamped discs 1, 2 and 3 be increased, the frictional forces will be increased, but if reduced, the frictional forces and frequency changes will be reduced. Also, if the clamped faces of the piezoelectric disc 1 or of the clamping lands 30 be made very smooth, or if the clamping lands 30 be composed of soft, spongy or resilient material, the frictional forces may be reduced and the resultant frequency changes in the piezoelectric plate 1 due to frictional conditions may be correspondingly reduced.

The magnitude of the frictional slipping forces also depends upon the differences in thermal expansions of the three clamped discs 1, 2 and 3, their compositions and points of clamping. If the piezoelectric crystal plate 1 be clamped along its axis of minimum thermal expansion, the frictional forces applied to the piezoelectric plate 1 may be reduced. Thus, due to the relatively greater thermal expansion along the X axis of the AT-cut type quartz crystal plate 1 of Fig. 3 than that along the Z′ axis thereof, the frictional forces may be reduced if the AT-cut quartz piezoelectric plate 1 be clamped along its Z′ axis rather than along its X axis. For this purpose, the axis e—e of the clamping lands 30 of both the members 2 and 3 may be aligned with the Z′ axis of the piezoelectric plate 1 as illustrated in Fig. 2, in order to reduce changes in the frequency of vibration due to temperature changes. This is for the reason that the AT-cut type quartz crystal plate 1 referred to has a minimum temperature coefficient of expansion of about 9.8 along the direction of its Z′ axis, as compared with about 13.4 along the direction of its X or X′ axis.

Another factor affecting the magnitude of the frictional forces applied to the piezoelectric plate 1 and its frequency of vibration is the composition of the electroded members 2 and 3. If the electroded members 2 and 3 be composed of material which has a thermal expansion equal or nearly equal to that of the piezoelectric crystal plate 1 along a selected axis thereof and if the axis e—e of the clamping lands 30 of the members 2 and 3 be aligned with that selected axis of the crystal plate 1, the frictional forces due to temperature changes may be reduced. In the case of the AT-cut type quartz crystal plate 1, the coefficient of thermal expansion being about 13.37 along the X axis, about 9.78 along the Z′ axis and of intermediate values between the X and Z′ axes as measured in parts per million per degree centigrade, the electroded members 2 and 3 may be composed of material which matches or nearly matches one of these values and used to clamp the crystal plate 1 along the axis of the matching thermal expansions. The coefficient of thermal expansion of a common ceramic material known in the trade as "Steatite F66" is about 5.2 parts per million per degree centigrade at a temperature of about 25 degrees centigrade, and that of a ceramic material known in the trade as "Alsimag 243" is about 9.0 parts per million per degree centigrade at a temperature of about 25 degrees centigrade. The thermal expansion of the "Alsimag 243" is therefore about equal to that of the AT-cut type quartz plate 1 along the Z′ axis thereof, and may be conveniently utilized as the electroded members 2 and 3 for clamping the quartz plate 1 by means of lands 30 positioned along the Z′ axis of the quartz plate 1, with little disturbance to the crystal frequency due to temperature change on changing the direction of heat flow from heating to cooling, or vice versa.

Another feature of interest in connection with this invention is that the contact location dimension θ of the clamping lands 30 may be proportioned to control the temperature-frequency characteristics of the clamped piezoelectric crystal plate 1 and to obtain a substantially zero hysteresis loop effect in the temperature-frequency curves thereof. The dimension θ of the lands 30 may be proportioned to reduce the frictional effects upon the frequency of the piezoelectric crystal plate 1 in view of certain force-frequency relations obtaining in the piezoelectric plate 1. For example, if an external force is applied to an AT-cut type quartz crystal plate 1 parallel to the major faces thereof and along the direction of the X axis or the Z′ axis which is perpendicular to the X axis, the frequency of the crystal plate will be increased or decreased dependent upon whether the force is a compression or a tension applied to the crystal plate 1 and dependent upon whether the force is applied along the direction of the X axis or along the direction of the Z′ axis. More particularly, in the case of an AT-cut type of quartz crystal plate 1, it has been observed that the thickness shear mode frequency increases if the applied force is a compression along the direction of the X axis and decreases if the applied force is a tension along the direction of the X axis, and also that the frequency decreases if the applied force is a compression along the direction of the Z′ axis and increases if the applied force is a tension along the direction of the Z′ axis. These opposite force-frequency effects may be made use of in connection with the proportion of the dimension θ of the clamping lands 30 in order to control the frictional forces and the temperature-frequency characteristics of the crystal unit.

The insulating electroded disc members 2 and 3, composed of any suitable material may be provided with two pairs of oppositely disposed clamping lands 30 of the type illustrated in Fig. 4 having critical dimensions θ made of values suitable to reduce the temperature-frequency hysteresis loop to zero. The axis e—e of the clamping lands 30 of each of the pair of electroded members 2 and 3 may be aligned with respect to each other and with respect to the Z′ axis for example of the AT-cut type piezoelectric quartz plate 1 so that the quartz plate 1 is clamped by the two pairs of lands 30 along its Z′ axis as illustrated in Fig. 2, with the lengths θ of the clamping lands 30 being so proportioned that the effect of the component of frictional force along the X axis of the crystal plate 1 nullifies the effect of the component of frictional force along the Z′ axis of the quartz plate 1, thereby to render the frequency of the assembled crystal unit substantially free from changes due to frictional forces applied to the quartz plate 1 by the lands 30 and resulting from differences in thermal expansions of the quartz plate 1 and the clamping electroded members 2 and 3.

As an illustrative example in a particular case where the piezoelectric crystal plate 1 is an AT-cut type of quartz crystal disc 1 operating in a thickness shear mode of motion at a frequency anywhere in the range from about 15 to 50 megacycles per second and having a diameter of about 0.500 inch, and where the two similar electroded members 2 and 3 have a diameter about equal to that of the quartz crystal disc 1, and are composed of ceramic "Steatite F66" discs 2 and 3 each provided with two peripheral lands 30 of the type illustrated in Fig. 4 having an axis $e—e$ aligned along the Z′ axis of the AT-cut type quartz crystal disc 1 so that the quartz crystal disc 1 is clamped along its Z′ axis as illustrated in Fig. 2 and where this arrangement is assembled in a crystal unit of the type illustrated in Fig. 1 and clamped under a pressure of about 10 to 20 ounces by the spring 5, then the dimension $\theta$ of the narrow strip lands 30 of Fig. 4 may be made to be about 21 degrees in order to obtain a zero or nearly zero temperature-frequency hysteresis loop to thereby render the temperature-frequency characteristic of the crystal unit substantially constant and free from changes in frequency that would otherwise be produced from changes from reversals from heating to cooling temperatures, or vice versa, applied thereto. While a very particular example for the dimensioning of the dimension $\theta$ of the lands 30 has been given, it will be understood that the dimension $\theta$ of the lands 30 may be proportioned to suit other particular cases by adjustments in the dimensions $\theta$ of the land 30 in order to obtain the desired zero or other controlled value for the temperature-frequency hysteresis loop characteristic.

Instead of being constructed of ceramic material, the electroded members 2 and 3 may be constructed of crystal quartz which may be cut to have the same crystallographic orientation as that of the piezoelectric vibratory element 1. In a particular example, three AT-cut type quartz crystal discs 1, 2 and 3 of the same shape, size and orientation may be used, the X axis of each of the three quartz crystal discs 1, 2 and 3 being aligned with respect to each other so that the thermal expansion of all three discs 1, 2 and 3 may be substantially the same in any given direction parallel to the major faces thereof. In such an arrangement, the quartz crystal electroded members 2 and 3 may be provided with pairs of oppositely disposed clamping lands 30 of the type illustrated in Figs. 4 and 5 having respectively, two or four lands 30 on each of the electroded members 2 and 3. In the case where the two lands arrangement of Fig. 4 is used, the axis $e—e$ thereof as illustrated in Fig. 4 may be along the Z′ axis thereof so that the pressure clamping forces applied on all three of the quartz crystal discs 1, 2 and 3 may be along the Z′ axis thereof, which is the axis of minimum thermal expansion for the three AT-cut type quartz crystal discs 1, 2 and 3. Alternately, the axis $e—e$ of the clamping lands 30 of Fig. 4 instead of being aligned along the Z′ axis, may be aligned along another axis, such as along the X axis of each of three quartz crystal discs 1, 2 and 3.

While the electroded members 2 and 3 have been particularly described herein as being made of ceramic or of quartz material, it will be understood that they may be made of other material, with steps being taken to insure that the frictional slipping forces between the piezoelectric body 1 and the clamping lands 30 will be uniform and the clamping lands 30 proportioned with respect to the opposite effects found along the mutually perpendicular Z′ and X axes of the AT-cut quartz crystal plate 1.

The results in the particular example described for proportioning the lands 30 for ceramic "F66" type electroded members 2 and 3 may be arrived at by trial or by following a procedure somewhat as follows.

As illustrated in Fig. 7, the frictional forces imposed as a restraint on the freedom of vibration of the crystal plate 1 may be evaluated by a coefficient of friction that expresses the limiting frictional resistance to relative motion of the clamping land 30 on the surface of the crystal plate 1. For a metallic coating of polished silver in contact with a quartz plate finished to have an abrasive texture typical only of 304 emery and then etched in hydrofluoric acid to remove one micron from its thickness, the coefficient of frictional resistance expressed in terms of frequency shift for the AT-cut type crystal blank may be plotted as $\alpha m$ as in Fig. 7 for the angle of location of the lands 30 of $\beta$ degrees from the X axis of the quartz crystal plate 1.

As illustrated in Fig. 8, the relative displacement of the clamping lands 30 upon the surface of the crystal plate 1 may be obtained by evaluating the difference between the temperature coefficient of linear expansion of the crystal plate 1 along the axis of $\beta$ from the X axis, from the temperature coefficient of linear expansion of the mounting material of the electroded discs 1 and 2. The evaluation is plotted as $a$ in Fig. 8 for several mounting materials. A positive value for $a$ indicates that the relative motion of the clamping lands 30 is away from the center of the disc 1 and results in a tensile force being imposed upon the vibrations of the crystal plate 1 along the axis of $\beta$ from the X axis.

As illustrated in Fig. 9, the evaluation of the frictional effect for a temperature gradient that causes the ambient temperature of the crystal unit to change 2 degrees per minute is plotted as $\alpha F$ for several mounting materials. Empirically, these data are obtained by measuring $a$ at various angles $\beta$ of two clamping lands 30 as in Fig. 4 having a maximum dimension of $\theta=10$ degrees and then measuring the greatest frequency deviation to evaluate $\alpha m$ obtained for a constant force F when the temperature of the unit is changed at rates from 1 degree per minute to 15 degrees per minute. The greatest value of $\alpha$ found in this manner may be plotted as $\alpha m$ for the particular angle $\beta$. For polished silver lands 30 and a quartz crystal plate 1 prepared as aforementioned the evaluation of $\alpha$ for a temperature gradient of 2 degrees per minute or less is $\alpha=0.1\ a\alpha m$. This empirical result is plotted in Fig. 9 and the frictional frequency deviation given as $\alpha F$ where F is the force of the spring 6 in ounces.

Fig. 9 shows that the clamping land 30 may be shaped as in Fig. 4 and the frequency instability reduced to zero if $\theta$=about 21 degrees for fused quartz electroded members or "F66" ceramic electroded members 2 and 3, $\theta=19$ degrees for ceramic "Alsimag 243" electroded mounting members 2 and 3 and $\theta=17$ degrees for X quartz electroded mounting members 2 and 3 with the axis $e—e$ of the electrodes 2 and 3 parallel to the Z′ axis of the crystal plate 1. The Z quartz electroded mounting member 2 and 3 refers to an AT-cut quartz disc fashioned as an electroded mounting member as in Fig. 4 and with the axis $e—e$ along the Z′ axis of the material. The X quartz electroded members 2 and 3 are similarly AT-cut quartz but the axis $e—e$ is the X′ axis of the electrode and crystal plate 1 of the material. In the case of the Z quartz electroded mounting members 2 and 3, the thermal expansion along all axes will be alike and matched if the $e—e$ axis of the quartz electrodes 2 and 3 is parallel to the Z′ axis of the crystal plate 1. No forces will appear in restraint of the vibration of the crystal plate 1 since there will be no differential thermal effects. The land length $\theta$ is in this case immaterial as long as the areas of land disposed on either side of the $e—e$ axis are equal and symmetrical about the $e—e$ axis.

Fig. 9 also shows that if a mounting member 2 or 3 consists of a pair of lands 30 symmetrically disposed about the axis $e—e$ of the member 2 or 3 and the area of the pair of lands be totally included within the angles $\theta=7$ degrees on either side of the $e—e$ axis, then as the pair of electroded materials 2 and 3 are rotated with respect to the X axis of the crystal plate 1, then at each angle $\beta$, as in Fig. 3, the total frequency drift is expressed as:

$$\Delta f=2\alpha F \text{ cycles}/10^6 \text{ cycles}$$

in which F is in ounces of spring force and $\alpha$ is the frictional affect along the angle of $\beta$.

Fig. 9 also shows that the electroded material 2 and 3 may be any suitable material whatsoever as long as the clamping lands are circular areas 30a, as in Fig. 4A, and disposed at an angle of $\theta$=about 10 degrees from axis $e—e$ and the discs 2 and 3 are oriented in mounting so that the Z′ axis of the quartz crystal plate 1 coincides with the axis $e—e$.

Fig. 9 also shows that the use of fused quartz electroded members 2 and 3 with the clamping lands 30 of any suitable length and with axis $e—e$ of the lands 30 coincident with the X axis of the crystal plate 1, the frequency changes may become quite precipitous with the drift curve A or B of Fig. 6 having little or no curvature depending on the clamping force F and with a temperature gradient of less than 2 degrees per minute.

Fig. 9 also shows that the same proportioning of the lands 30 indicated by the length $\theta$ aforementioned for each of the electroded materials 2 and 3 is the correct proportioning required when the freely slipping metallic coatings 30 are replaced by a cementing material 30 rigidly attaching the electroded material 2 and 3 to the crystal plate 1 and thereby reducing the frequency drift due to slipping to zero and also eliminating substantially the lack of retraceability when the rate of flow of heat into the unit is varied. The critical clamping length $\theta$ comprises a region over which the frequency changes in one direction are nullified by the frequency changes in the other direction.

While the matter of proportioning the dimensions $\theta$ of the clamping lands 30 to control the temperature-frequency characteristics of the crystal unit and to reduce to zero the temperature-frequency hysteresis loop has been described particularly with reference to two pairs of lands 30 of the type illustrated in Fig. 4, it will be understood that similar results may be obtained when the mounting members 2 and 3 consist of AT-cut quartz crystal each having four lands 30 disposed as shown on Fig. 5 and the mounting members 2 and 3 are orientated with respect to the quartz crystal plate 1 in such a manner that the X axes of the three discs 1, 2 and 3 are parallel.

Similar results may also be obtained if instead of the full peripheral strip land 30 as in Fig. 4, half of each land 30 be removed so all that remains is two oppositely disposed lands 30 of $\theta$ degrees one above the axis $e—e$ and the other on the opposite end of the $e—e$ axis but below it. If the land is so foreshortened to this dimension $\theta$, then the length $\theta$ aforementioned for each of the electroded materials 2 and 3 is the required proportioning with the axis $e—e$ aligned parallel to the Z″ axis of the quartz crystal plate 1. Similar results may also be obtained if the foreshortened land 30 described above is divided into two smaller and equal sections, one section having its boundary on the $e—e$ axis and the other section having its boundary on the axis $\theta$ degrees from the $e—e$ axis, the total area of the two pairs of sections being contained in the included angle between the $e—e$ axis and the axis at angle $\theta$ to the $e—e$ axis.

Also, it will be noted that the electroded members 2 and 3 may be composed of any suitable material if the clamping pressure is reduced to a point that just insures contact of the lands 30 or 30a with the piezoelectric quartz plate 1, and if the lands 30 or 30a be made of polished well-adhering silver coatings on the electroded members 2 and 3, and if the major faces of the quartz plate 1 be made as smooth as possible, thereby to insure that the frictional forces between the clamping lands 30 or 30a and the quartz plate 1 will be reduced to a point where temperature changes may not affect the temperature-frequency characteristic of the piezoelectric plate 1.

Also, it will be noted that the electroded members 2 and 3 may be composed of any suitable material if there is interposed between the crystal plate 1 and the lands 30 or 30a of the electroded members 2 and 3 a thin rubber-like film of material that does not impede the vibrations of the crystal plate 1 in piezoelectric response to the voltage applied to the electrodes 31.

Also it will be noted that the electroded members 2 and 3 may be composed of any suitable material if the clamping lands 30a are made as circular areas as illustrated in Fig. 4A with the angle $\theta$=about 10 degrees and the discs 1, 2 and 3 orientated so that the Z′ axis of crystal disc 1 coincides with the $e—e$ axis of the electroded members 2 and 3. Also it will be noted that the electroded members 2 and 3 may be composed of any suitable material if a pair of clamping lands 30a are disposed on an axis of $\theta=10$ degrees and the pair of lands are circular in shape, or otherwise shaped so that the areas on either side of the $\theta=10$ degree-axis are equal and do not extend over an arcuate length of more than 7 degrees on either side of the $\theta=10$ degree-axis illustrated in Fig. 4A.

Another feature of interest is that the temperature gradient effect, as illustrated by the curves in Fig. 6, may itself be controlled to be repetitious and that, if desired, an almost vertical shift in the frequency as from the upper to the lower curve in Fig. 6 or vice versa, may be effected in the crystal unit with small reverses in applied temperature. For this purpose, the clamping pressure may be made uniform and relatively large and applied by the clamping lands 30 along the axis of maximum thermal expansion which is the X axis of an AT-cut type quartz plate 1, for example.

Another feature of interest is that the factors hereinbefore mentioned for controlling the temperature-frequency and the force-frequency effects with respect to AT-cut type quartz plates may also be used to control similar effects in BT-cut type quartz plates, and in other crystal plates.

While particular forms for the electroded members 2 and 3 and for the metallic coatings 30 and 30a thereon have been described by way of example, it will be understood that other forms may be utilized in accordance with the principles of this invention, and although this invention has been described and illustrated in relation to specific arrangements, it is to be understood that it is capable of application in other organizations and is therefore not to be limited to the particular embodiments disclosed.

What is claimed is:

1. Piezoelectric crystal apparatus comprising a piezoelectric quartz crystal body having mutually perpendicular X′ and Z′ axes extending along the major faces of said body, and mounting means for said body comprising strips of material disposed in contact with portions of said major faces of said body at regions thereon along said Z′ axis of said body, said strips each having an angular length transverse to said Z′ axis of substantially one of the values from 17 to 21 degrees as measured from said Z′ axis to an extreme end of said strip.

2. Piezoelectric crystal apparatus comprising a piezoelectric quartz crystal body having a pair of neutral axes extending along its major faces and positioned intermediate the mutually perpendicular X′ and Z′ axes extending along said major faces of said body, said neutral axes being inclined at angles of substantially 10 degrees with respect to said Z′ axis on opposite sides thereof, and mounting means for said body comprising spots of material disposed in contact with portions of said major faces of said body at points along and on said neutral axes only of said major faces of said body.

3. Piezoelectric crystal apparatus comprising a piezoelectric crystal body having mutually perpendicular axes extending along its major faces wherein the effect of compression and tension forces applied along the direction of one of said axes is to increase and decrease respectively the frequency of said body, and oppositely wherein the effect of compression and tension forces applied along the direction of the other of said mutually perpendicular axes is to decrease and increase respectively the frequency of said body, and support means for said body including oppositely disposed lands secured in fixed contact relation with portions of said faces of said body within selected oppositely disposed regions thereon located along and in predetermined relation with respect to one of said mutually perpendicular axes of said body, said regions for locating said lands having a selected angular length of one of the values in the range substantially from 10 to 21 degrees as measured transversely from said one of said axes to the extreme end of said respective regions and lands and thereby corresponding to values substantially nullifying said opposite force-frequency effects obtaining along said mutually perpendicular axes along said faces of said body for rendering said body substantially free from frequency changes resulting from forces applied to said body through said lands due to differences in thermal expansions of said body and said support means.

4. Piezoelectric crystal apparatus in accordance with claim 3, said one of said axes of said body with respect to which said lands are positioned being an axis having substantially the minimum value of thermal expansion along said faces of said body.

5. Piezoelectric crystal apparatus in accordance with claim 3, said one of said axes with respect to which said lands are positioned being an axis having substantially the minimum value of thermal expansion along said faces of said body, said body being a quartz crystal body having said mutually perpendicular axes, said last-mentioned axes being the X and Z′ axes along said faces thereof, and said axis of substantially minimum thermal expansion being said Z′ axis of said body.

6. Piezoelectric crystal apparatus in accordance with claim 3, said axis of said body with respect to which said lands are positioned being an axis having a predetermined value of thermal expansion along said faces of said body, said support means including support members for said lands, said members comprising material having a thermal expansion in the direction of said last-mentioned axis substantially equal to or matching said thermal expansion of said body along said last-mentioned axis thereof.

7. Piezoelectric crystal apparatus in accordance with claim 3, said axis of said body with respect to which said lands are positioned being an axis having substantially the minimum value of thermal expansion along said faces of said body, said support means including support members for said lands, said members comprising a ceramic material, said body being a quartz crystal body having said mutually perpendicular X and Z′ axes along said faces thereof, and said axis of substantially minimum thermal expansion being said Z′ axis of said body.

8. Piezoelectric crystal apparatus in accordance with claim 3, said support means including support members for said lands, said members comprising an insulating material, and said lands comprising metal coatings formed integral with said support members.

9. Piezoelectric crystal apparatus in accordance with claim 3, said support means including support members for said lands, said members comprising an insulating material, and said lands comprising metal coatings formed integral with said support members, said metal coatings comprising relatively soft silver coatings adhering to said support members, and said support means constituting pressure-clamping means exerting a clamping pressure just sufficient to insure contact of said relatively soft metal lands with said harder surfaced crystal body.

10. Piezoelectric crystal apparatus comprising a frequency controlling piezoelectric crystal body having mutually perpendicular axes extending along its major faces, a pair of members comprised of insulating material having their inner major surfaces disposed adjacent said opposite major faces of said body, means including oppositely disposed metallic coatings formed integral with said inner major surfaces of said pair of members and spaced by an air-gap in out of contact relation with respect to said opposite major faces of said body for providing an electric field through the central region of said body, support means for said body including a plurality of pairs of oppositely disposed raised lands comprising metallic coatings formed integral with said inner major surfaces of said pair of members and disposed in contact relation with portions of the peripheral region of said opposite major faces of said body for pressure-clamping said body between said lands by said pair of members, said lands being positioned at regions on said body adjacent the opposite ends of one of said axes of said body with their lengths extending transversely to said one axis on opposite sides thereof and along said peripheral region of said major faces of said body, said lengths of said lands being proportioned to have dimensions and positions in selected relation with respect to said mutually perpendicular axes to thereby constitute means for substantially nullifying the effect upon said frequency of the component of force along one of said mutually perpendicular axes with respect to that along the other of said axes of said body resulting from frictional forces applied to said body through said lands due to reversals in temperature gradients applied thereto and thereby constituting means for rendering said body substantially free from frequency changes resulting from said frictional forces applied to said body through said lands due to differences in thermal expansions of said body and said pair of members.

11. Piezoelectric crystal apparatus comprising a frequency controlling piezoelectric crystal body having mutually perpendicular axes extending along its major faces, a pair of members comprised of insulating material having their inner major surfaces disposed adjacent said opposite major faces of said body, means including oppositely disposed metallic coatings formed integral with said inner major surfaces of said pair of members and spaced by an air-gap in out of contact relation with respect to said opposite major faces of said body for providing an electric field through the central region of said body, support means for said body including a plurality of pairs of oppositely disposed raised lands comprising metallic coatings formed integral with said inner major surfaces of said pair of members and disposed in contact relation with portions of the peripheral region of said opposite major faces of said body for pressure-clamping said body between said lands by said pair of members, said lands being positioned at regions on said body in predetermined relation with respect to opposite ends of one of said axes of said body with their areas disposed adjacent to said one axis and on opposite sides thereof and along said peripheral region of said major faces of said body, said areas of said lands being proportioned to have dimensions and locations in selected relation with respect to said mutually perpendicular axes to thereby constitute means for substantially nullifying the effect upon said frequency of the component of force along one of said mutually perpendicular axes with respect to that along the other of said axes of said body resulting from frictional forces applied to said body through said lands due to reversals in temperature gradients applied thereto and thereby constituting means for rendering said body substantially free from frequency changes resulting from said frictional forces applied to said body through said lands due to differences in thermal expansions of said body and said pair of members, said one axis of said body being an axis having substantially the minimum value of thermal expansion along said major faces of said body.

12. Piezoelectric crystal apparatus comprising a frequency controlling piezoelectric crystal body having mutually perpendicular axes extending along its major faces, a pair of members comprised of insulating material having their inner major surfaces disposed adjacent said opposite major faces of said body, means including oppositely disposed metallic coatings formed integral with said inner major surfaces of said pair of members and spaced by an air-gap in out-of-contact relation with respect to said opposite major faces of said body for providing an electric field through the central region of said body, support means for said body including a plurality of pairs of oppositely disposed raised lands comprising metallic coatings formed integral with said inner major surfaces of said pair of members and disposed in contact relation with portions of the peripheral region of said opposite major faces of said body for pressure-clamping said body between said lands by said pair of members, said lands being positioned at regions on said body in predetermined relation with respect to opposite ends of one of said axes of said body with their areas disposed adjacent to said one axis and on opposite sides thereof and along said peripheral region of said major faces of said body, said areas of said lands being proportioned to have dimensions and locations in selected relation with respect to said mutually perpendicular axes to thereby constitute means for substantially nullifying the effect upon said frequency of the component of force along one of said mutually perpendicular axes with respect to that along the other of said axes of said body resulting from frictional forces applied to said body through said lands due to reversals in temperature gradients applied thereto and thereby constituting means for rendering said body substantially free from frequency changes resulting from said frictional forces applied to said body through said lands due to differences in thermal expansions of said body and said pair of members, said one axis of said body being an axis having substantially the minimum value of thermal expansion along said major faces of said body, said axis of substantially minimum thermal expansion being the Z′ axis of said body, and said body being an AT-cut quartz crystal element having mutually perpendicular X and Z′ axes along said major faces thereof.

13. Piezoelectric crystal apparatus comprising a frequency controlling piezoelectric crystal body having mutually perpendicular axes extending along its major faces, a pair of members comprised of insulating material having their inner major surfaces disposed adjacent said opposite major faces of said body, means including oppositely disposed metallic coatings formed integral with said inner major surfaces of said pair of members and spaced by an air-gap in out of contact relation with respect to said opposite major faces of said body for providing an electric field through the central region of said body, support means for said body including a plurality of pairs of oppositely disposed raised lands comprising metallic coatings formed integral with said inner major surfaces of said pair of members and disposed in contact relation with portions of the peripheral region of said opposite major faces of said body for pressure-clamping said body between said lands by said pair of members, said lands being positioned at regions on said body along axes inclined substantially 10 degrees with respect to one of said mutually perpendicular axes of said body with their areas disposed transversely to said one axis and on opposite sides thereof and along said peripheral region of said major faces of said body, said areas of said lands being proportioned to have dimensions and locations corresponding to values substantially in selected relation with respect to said mutually perpendicular axes thereby constituting means for rendering said body substantially free from frequency changes resulting from frictional forces applied to said body through said lands due to differences in thermal expansions of said body and said pair of members.

14. Piezoelectric crystal apparatus comprising a piezoelectric crystal body having mutually perpendicular axes extending along its major faces, a pair of members comprised of insulating material having their inner major surfaces disposed adjacent said opposite major faces of said body, means including oppositely disposed metallic coatings formed integral with said inner major surfaces of said pair of members and spaced by an air-gap in out of contact relation with respect to said opposite major faces of said body for providing an electric field through the central region of said body, support means for said body including a plurality of pairs of oppositely disposed raised lands comprising metallic coatings formed integral with said inner major surfaces of said pair of members and disposed in contact relation with portions of the peripheral region of said opposite major faces of said body for pressure-clamping said body between said lands by said pair of members, said lands being positioned at regions on said body adjacent opposite ends of one of said mutually perpendicular axes of said body with their lengths extending transversely to said one axis on opposite sides thereof and along said peripheral region of said major faces of said body, said lengths of said lands being an angular length of one of the values in the range substantially from 17 to 21 degrees as measured transversely from said one axis to the remote edge of said respective lands, and thereby being proportioned to have values corresponding to values substantially constituting means for rendering said body substantially free from frequency changes resulting from frictional forces applied to said body through said lands due to differences in thermal expansions of said body and said pair of members, said one axis being the Z′ axis of said body, and said body being an AT-cut quartz crystal element having said mutually perpendicular axes comprising an X axis and said Z′ axis.

15. Piezoelectric crystal apparatus comprising a frequency controlling piezoelectric quartz crystal body having mutually perpendicular X and Z′ axes extending along its major faces, the thickness axis dimension extending between said major faces of said body being made of a value corresponding to the value of said frequency, and support means for said body including a pair of electroded clamping members having a plurality of pairs of oppositely disposed raised clamping lands thereon for clamping said major faces of said crystal body adjacent the peripheral region thereof between said pairs of oppositely disposed clamping lands, said clamping lands comprising metallic coatings formed integral with the inner major faces of said pair of clamping members, and said pair of clamping members being comprised of ceramic material, said clamping lands consisting of two pairs of oppositely disposed lands located in selected relation with respect to said X and Z′ axes and placed substantially along said Z′ axis only of said crystal body and disposed adjacent said peripheral region thereof with the lengths of said lands extending arcuately across and substantially transversely with respect to said Z′ axis of said crystal body, said lengths of said lands being proportioned to correspond to values sufficient to constitute means for substantially nullifying the effect upon said frequency of the component of force along said X axis on said crystal body with respect to the opposite effect of the component of force along said Z′ axis thereof resulting from frictional slipping force produced between said body and said clamping lands due to temperature changes.

16. Piezoelectric crystal apparatus comprising a frequency controlling piezoelectric crystal body having mutually perpendicular X and Z′ axes along its major plane section, and means including a pair of electroded clamping members having a plurality of pairs of oppositely disposed raised clamping lands thereon for clamping the major faces of said crystal body adjacent the peripheral region thereof between said pairs of oppositely disposed clamping lands, said clamping lands comprising metallic coatings formed integral with the inner major faces of said pair of clamping members, said piezoelectric crystal body being a quartz crystal body, and said pair of clamping members being comprised of quartz crystals having substantially the same crystallographic orientation or cut of quartz as that of said piezoelectric crystal body, the X axis of each of said pair of crystal quartz clamping members being substantially aligned and oppositely disposed with respect to each other, said clamping lands consisting of two pairs of oppositely disposed lands located in selected relation with respect to said X and Z′ axes and placed along said Z′ axis of said crystal quartz body with the length dimension of said lands extending substantially transversely with respect to said Z′ axis, said length dimensions of said lands being proportioned to correspond to values sufficient to constitute means for substantially nullifying the effect upon said frequency of said piezoelectric crystal body of the component of force along said X axis on said piezoelectric crystal body with respect to the opposite effect of the component of the force along said Z′ axis thereof resulting from frictional slipping force produced between said piezoelectric crystal body and said clamping lands due to temperature changes.

17. Piezoelectric crystal apparatus comprising a piezoelectric crystal plate having mutually perpendicular axes extending along its major faces and having a pair of neutral axes extending along said major faces intermediate said mutually perpendicular axes, and support means for said crystal plate comprising lands disposed in fixed contact relation with portions of said major faces at regions thereon located along, on and in selected positional relation with respect to said neutral axes to thereby constitute means for substantially nullifying the opposite effects upon the frequency of said crystal plate of the components of force along the directions of said mutually perpendicular axes resulting from forces introduced between said crystal plate and said lands due to different thermal expansions in said crystal plate and said support means.

FRANK CAROSELLI.

REFERENCES CITED

The following references are of record in the file of this patent:

UNITED STATES PATENTS

| Number | Name | Date |
|---|---|---|
| 2,076,060 | Bechmann et al. | Apr. 6, 1937 |
| 2,343,059 | Hight | Feb. 29, 1944 |

FOREIGN PATENTS

| Number | Country | Date |
|---|---|---|
| 490,579 | Germany | Jan. 30, 1930 |